United States Patent [19]

Karthe et al.

[11] 4,280,096
[45] Jul. 21, 1981

[54] SPECTROMETER FOR MEASURING SPATIAL DISTRIBUTIONS OF PARAMAGNETIC CENTERS IN SOLID BODIES

[75] Inventors: Wolfgang Karthe, Jena; Eike Wehrsdorfer, Eisenberg, both of German Democratic Rep.

[73] Assignee: Akademie der Wissenschaften der DDR, Berlin, German Democratic Rep.

[21] Appl. No.: 959,185

[22] Filed: Nov. 7, 1978

[51] Int. Cl.³ ............................................. G01N 27/00
[52] U.S. Cl. ..................................... 324/316; 324/309
[58] Field of Search ...................... 324/309, 316, 318

[56] References Cited

U.S. PATENT DOCUMENTS

| 3,771,054 | 11/1973 | Hyde | 324/316 |
| 4,070,611 | 1/1978 | Ernst | 324/309 |
| 4,115,730 | 9/1978 | Mansfield | 324/309 |

Primary Examiner—Michael J. Tokar
Attorney, Agent, or Firm—Michael J. Striker

[57] ABSTRACT

A spectrometer is disclosed in which gradient coils are provided in order to create an inhomogeneous magnetic field for use in analyzing individual regions within the sample under examination. The gradient coils and the modulating coils are operated by discrete pulses, rather than continuously. A keying unit coordinates the interaction of the various components of the spectrometer in order to monitor resonance of the sample under examination while such pulses occur.

5 Claims, 3 Drawing Figures

SPECTROMETER FOR MEASURING SPATIAL DISTRIBUTIONS OF PARAMAGNETIC CENTERS IN SOLID BODIES

RANGE OF FIELDS TO WHICH THE INVENTION APPLIES

The invention concerns spectrometers used for measuring the spatial distribution of paramagnetic centers, especially those used for the investigation of transport processes in solid bodies (diffusion), metabolic processes or pathological transformations in living bodies, or used for assessing the quality of the doping or crystals in epitaxial-growth techniques.

CHARACTERISTICS OF THE KNOWN TECHNICAL SOLUTIONS

Knowledge of the spatial distribution of imperfections in a solid body is of importance for many purposes. The measurement of such distributions can, in the simplest case, always be performed by removal of a definite volume of material from the object to be investigated, with either the removed part or the remaining part of the solid body being investigated using whatever methods appropriate. The main disadvantage of these methods is that they cannot be employed upon living bodies and for other bodies lead to destruction, so that no furher measurements can then be performed on the objects. However, several methods operating non-destructively are known: ultrasonic methods, x-ray methods, schlieren techniques in optics, the use of radioactive isotopes. With such methods, what can be measured are the distributions of special imperfections or characteristics within the object. It is also known that by means of suitable modification of nuclear magnetic resonance (NMR) techniques it is possible to measure the spatial distribution of nuclear magnetic moments and thereby of nuclei in an object of interest, non-destructively and sorted with regard to differing nuclei. With electron paramagnetic resonance (EPR) techniques and similar techniques (electron-nucleus double resonance (ENDOR), electron-electron double resonance (ELDOR)), what was measured up to now has been only the spatial distribution of paramagnetic centers performed by removal of definite volumes of material, i.e., involving simultaneous destruction of the sample.

OBJECT OF THE INVENTION

The object of the invention is to develop a spectrometer for the measurement of the spatial distribution of paramagnetic centers, sorted in accordance with the type of centers, and avoiding simultaneous destruction of the sample.

STATEMENT OF THE GIST OF THE INVENTION

The invention sets for itself the task to find suitable apparatuses with which spatial distributions of paramagnetic centers can be measured without simultaneous destruction of the sample.

In accordance with the present invention, this is achieved by bringing the sample to be investigated into an EPR spectrometer (or an ENDOR spectrometer, or an ELDOR spectrometer) utilizing a polarizing magnetic field having an inhomogeneous magnetic-field distribution across the sample. In this way it is possible to have the resonance criterion satisfied only for the paramagnetic centers in definite, selected regions of the sample. By well-defined variation of the magnetic field distribution and its intensity, one achieves a complete representation of the spatial distribution of the centers in the sample.

The inhomogeneous field distribution is achieved by superimposing onto the polarizing magnetic field of the spectrometer, which in general is quite homogeneous, supplemental field gradients used to achieve high spatial resolution in the measurement of the distribution of centers, generated in up to three dimensions, with very high field gradients, used to achieve a high spatial resolution in the measurement of the distribution of centers, being established by means of a quasi-static pulsed mode of operation.

The spectrometer output signal picked up during application of the inhomogeneous field distribution and, for example, utilizing variation with respect to time of the homogeneous polarizing magnetic field, represents the folding of the EPR spectrum (or ENDOR or ELDOR spectrum) of the centers as a function of e.g., the magnetic fields and with their spatial distribution.

Suitable variation of the field configuration makes possible a mathematical unfolding or development and accordingly representation of the distribution of centers.

The inventive spectrometer is characterized in that it comprises an apparatus for the creation of gradients in the polarizing magnetic field, an amplifier, a rectifier and a storage or computing unit for preliminary processing and storage of the signal; the apparatus creating gradients in the polarizing magnetic field is made up of coils having winding surfaces of circular-cylindrical, rectangular or other form so arranged relative to the sample that the field gradients be freely selectable with respect to magnitude, phase and direction relative to the polarizing magnetic field; and an apparatus comprised of a pulse generator, a pulse amplifier, and a sampling unit is present for the pulsed generation of the field gradient and for the simultaneous pulsed control of the signal-indicating channel.

In the apparatus there can be provided a cavity resonator of rectangular cross section of oscillatory type $H_{10n}$ $E_{110}$ or equally well a resonant or non-resonant helical transmission guide for accommodating the sample. Use can also be made of one cavity resonator for two samples. The inventive apparatus has an arrangement for adjusting the position and direction of the gradient coils. The pulsed control of the signal-indicating channel can be implemented either by pulsed control of the modulating amplitude of magnetic field, or by pulsed modulation of the amplitude or phase, or both, of the microwaves or by keying the intensity of the polarizing magnetic field. However, it is also possible to provide an arrangement for the simultaneous pulsed keying of a two-fold or manifold combination of the amplitude and the phase of the microwave, control of the amplification of the receiver, the modulating amplitude impressed on the magnetic field and the intensity of the polarizing magnetic field.

EXEMPLARY EMBODIMENT

The invention will now be explained with reference to an exemplary embodiment.

Figure 1:
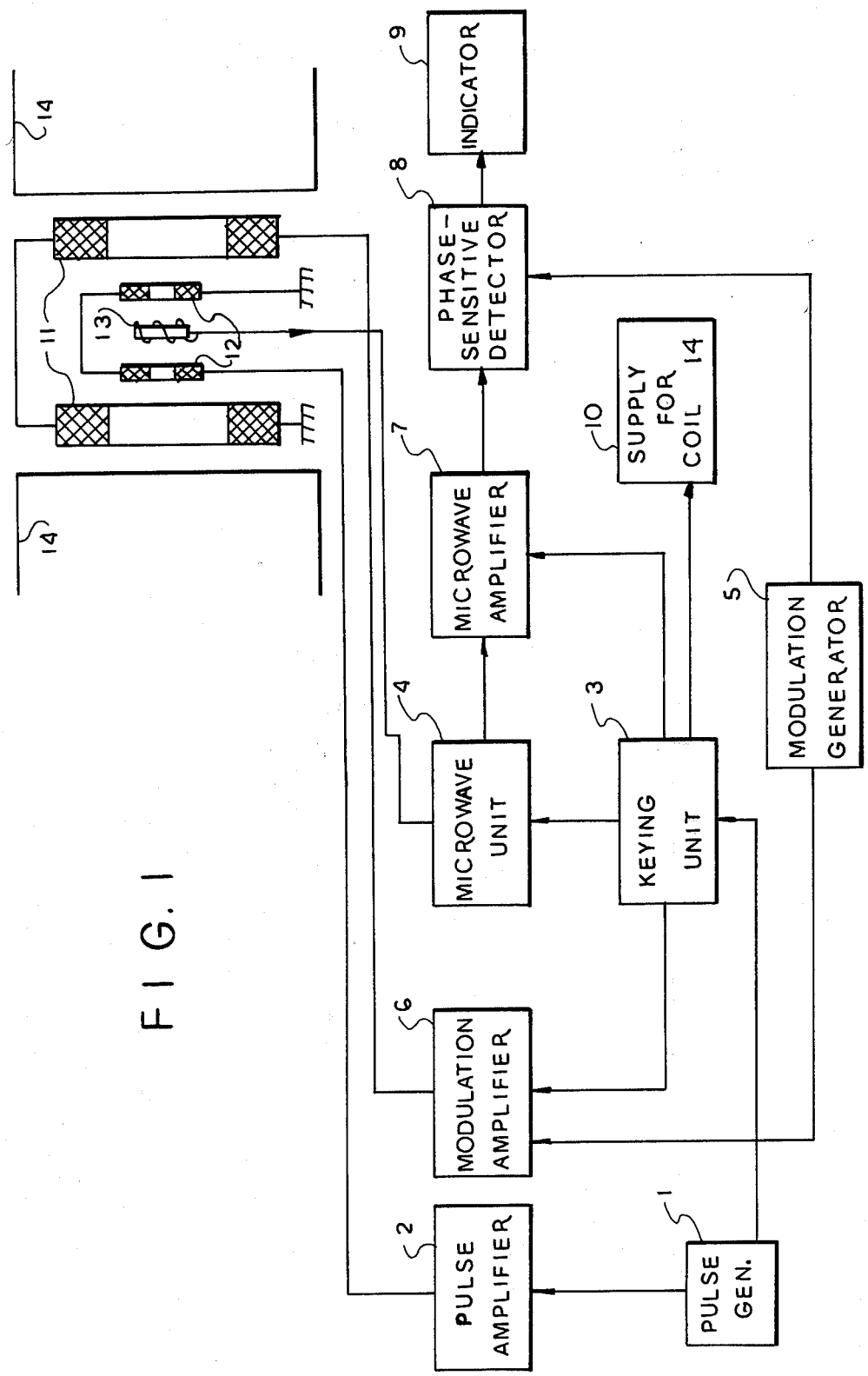
FIG. 1 is a block circuit diagram of the set up spectrometer.

The detection of the paramagnetic centers is performed with an EPR spectrometer of conventional construction, comprising a cavity resonator 13 containing the sample and located in the polarizing field of an electromagnet 14, a microwave unit 4 including generator and detector, electronic detecting circuitry including an amplifier 7, a phase-sensitive detector 8, and an indicator device 9. The energization of the magnet is effected by means of a magnetizing-current supply and regulating stage 10. In conventional fashion, use is made of the technique of magnetic field modulation to improve sensitivity; the field modulation is established by means of modulating coils 11, and the modulating current is generated by a modulation generator 5 and amplified by a modulation amplifier 6. In the present embodiment, gradient coils 12 are used to establish the inhomogeneous magnetic field required for the discrimination of the distribution of centers.

The very high field gradients needed to achieve high spatial resolution are produced by pulsed energization of the gradient coils 12, in order to keep the average power low. A pulse generator 1 and a pulse amplifier 2 are employed for activating the coils. With such an arrangement, it would be possible to achieve field gradients of up to 0.15 teslas per centimeter and experimentally a spatial resolution up to 12 microns.

Figure 2:
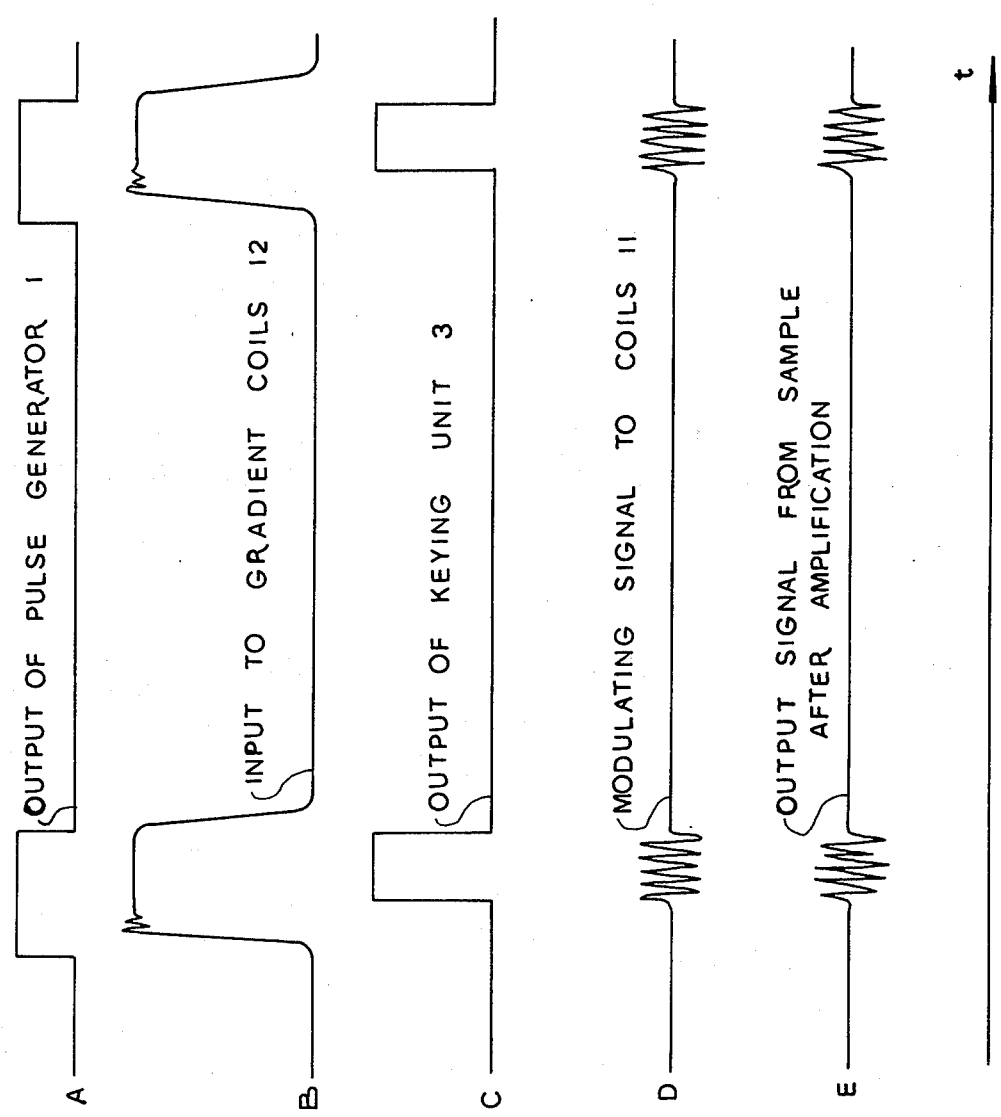
FIG. 2 depicts recorded pulsed voltage within the set up spectrometer.

Because during the pause intermediate successive pulses the signal is measured by all paramagnetic centers of the sample, appropriate measures are provided to suppress them. These measures are implemented utilizing a keying unit 3. Using a first technique, during the application of the pulsed inhomogeneous field the detector channel in the microwave unit 4 is keyed on with a timing corresponding to the output voltage A of pulse generator 1 and output voltage B of pulse amplifier 2 (FIG. 2), in correspondence to an output voltage C of keying unit 3, and at other times kept off. This can be effected e.g. with suitable microwave switches of the ferrite or semi-conductor type. Using a second technique, the keying of the detector channel is performed in amplifier 7 in correspondence to an output voltage C of the keying unit 3.

Particularly advantageous is a third technique, according to which the modulation amplifier 6 is keyed in correspondence to an output voltage C from keying unit 3 such that the modulation field is applied only during the pulse length for the field gradient corresponding to a pulsewise keyed modulation voltage B. The output signal, which is proportional to the number of centers in the investigated volume of material, has an analog appearance corresponding to a signal voltage E prior to rectification, for all three techniques just set forth.

If the height of the current pulses producing the field gradient is fixed, the distribution of centers can for example be picked up by variation of the polarizing field of the electromagnet 14.

Figure 3:
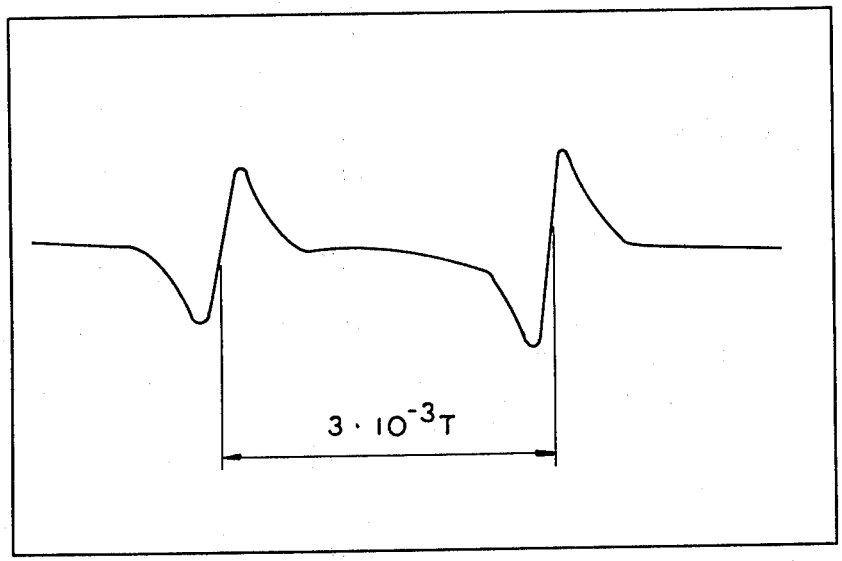
FIG. 3 depicts the recording of an instrument-drawn EPR spectrum of two separate, almost point-like samples of a substance, containing paramagnetic centers of a type whose spectrum consists of one line.

FIG. 3 depicts, by way of example, the thusly obtainable recording of an instrument-drawn EPR spectrum of two spatially separated almost point-like samples of a substance containing paramagnetic centers of a type whose spectrum consists of one line.

The claimed invention is:

1. In a spectrometer which contains a field coil, modulating coils, and gradient coils and applies a modulated inhomogeneous magnetic field to a sample, an improvement comprising:
   means for adjusting orientation of the modulating coils and gradient coils with respect to the sample;
   a modulation generator providing a modulating waveform for use in the modulating coils;
   a pulse generator providing pulses for use in the gradient coils;
   a first means connected to the sample and responsive to resonance thereof; and
   a keying unit cooperating with the modulation generator, the pulse generator, and the first means, the keying unit operating in a manner that the modulated inhomogeneous magnetic field is applied in pulses and the first means responds to resonance of the sample during and only during such pulses.

2. In a spectrometer which contains a field coil, modulating coils, and gradient coils and applies a modulated inhomogeneous magnetic field to a sample, an improvement comprising:
   a cavity resonator containing the sample;
   a modulation generator providing a modulating waveform for use in the modulating coils;
   a pulse generator providing pulses for use in the gradient coils;
   a first means connected to the sample and responsive to resonance thereof; and
   a keying unit cooperating with the modulation generator, the pulse generator, and the first means, the keying unit operating in a manner that the modulated inhomogeneous magnetic field is applied in pulses and the first means responds to resonance of the sample during and only during such pulses.

3. In a spectrometer which contains a field coil, modulating coils, and gradient coils and applies a modulated inhomogeneous magnetic field to a sample, an improvement comprising:
   a helical transmission guide containing the sample;
   a modulation generator providing a modulating waveform for use in the modulating coils;
   a pulse generator providing pulses for use in the gradient coils;
   a first means connected to the sample and responsive to resonance thereof; and
   a keying unit cooperating with the modulation generator, the pulse generator, and the first means, the keying unit operating in a manner that the modulated inhomogeneous magnetic field is applied in pulses and the first means responds to resonance of the sample during and only during such pulses.

4. In a spectrometer which contains a field coil, modulating coils, and gradient coils and applies a modulated inhomogeneous magnetic field to a sample, an improvement comprising:
   a modulation generator providing a modulating waveform for use in the modulating coils;
   a pulse generator providing pulses for use in the gradient coils;
   a first means connected to the sample and responsive to resonance thereof; and
   a keying unit cooperating with the modulation generator, the pulse generator, and the first means, the keying unit operating to vary phase and amplitude of energization of the gradient coils with respect to energization of the modulating coils and further operating in a manner that the modulated inhomogeneous magnetic field is applied in pulses and the first means responds to resonance of the sample during and only during such pulses.

5. In a spectrometer which contains a field coil, modulating coils, and gradient coils and applies a modulated inhomogeneous magnetic field to a sample, an improvement comprising:

a modulation generator providing a modulating waveform for use in the modulating coils;

a pulse generator providing pulses for use in the gradient coils;

a first means connected to the sample and responsive to resonance thereof; and a keying unit cooperating with the modulation generator, the pulse generator, and the first means, and the keying unit operating in a manner that the modulated inhomogeneous magnetic field is applied in pulses and the first means responds to resonance of the sample during and only during such pulses, and further operating to vary the amplitude of that magnetic field produced by the field coil.

* * * * *